ELECTRICAL CONNECTION OF COMPONENTS TO PRINTED CIRCUITS

Filed Aug. 17, 1965

INVENTOR.
JOHN P. STELMAK

BY
Brown, Critchlow, Flick & Peckham.
ATTORNEYS.

United States Patent Office 3,344,316
Patented Sept. 26, 1967

3,344,316
ELECTRICAL CONNECTION OF COMPONENTS TO PRINTED CIRCUITS

John P. Stelmak, 325 Walnut St., Greensburg, Pa. 15601
Filed Aug. 17, 1965, Ser. No. 480,440
6 Claims. (Cl. 317—101)

ABSTRACT OF THE DISCLOSURE

A metal lead projecting from an electronic component has a plurality of minute protrusions on its bottom pressed into an underlying electrical conductor on an insulating base to form a good electrical connection.

As is well known, a printed circuit is formed from copper foil or plating adhering to an insulating board or base and etched to produce a network of electrical conductors. Wherever it is desired to connect an electronic component in the circuit, the copper conductor and underlying base are drilled to form a hole. A wire lead from the component then is inserted in the hole and soldered or welded to the conductor. Mechanical connection with the base and electrical connection with the conductor thus are formed.

It is among the objects of this invention to provide electrical connections for printed circuits, which are more reliable than heretofore, which do not require soldering or welding, which do not require heating, which may be made at several points simultaneously, and which may easily be removed for replacement.

In accordance with this invention, an insulating base is provided with a flat metal electrical conductor thereon. Adjacent the conductor there is an electronic component provided with a metal lead that extends over the conductor and has a plurality of minute protrusions on its bottom pressed into the conductor to form a multitude of electrical contacts with the conductor. The lead and conductor may be held together by adhesive, or the top of the lead may be engaged by an elastomer body, which is held compressed against the lead to press its protrusions into the conductor.

The invention is illustrated in the accompanying drawings, in which

Figures 1, 2, 3, 4, 5, 6:
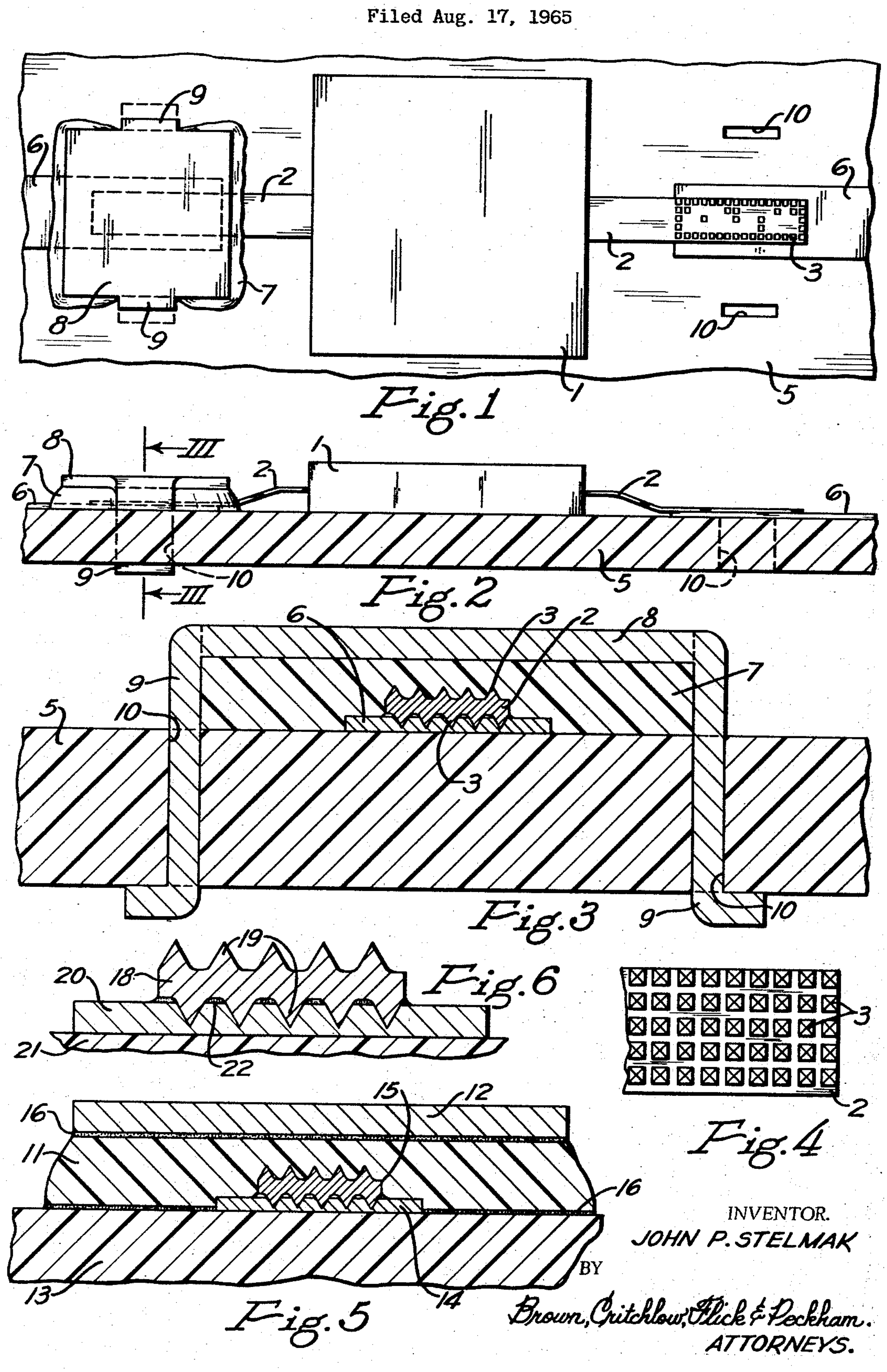
FIG. 1 is a greatly enlarged plan view of an electronic component with one lead connected to a printed circuit and another lead not yet connected.
FIG. 2 is a side view, with the circuit board shown in section.
FIG. 3 is a still further enlarged cross section through a connection, taken on the line III—III of FIG. 2.
FIG. 4 is an enlarged fragmentary plan view of one of the leads.
FIG. 5 is a view, similar to FIG. 3 of a modification.
FIG. 6 is a further enlarged fragmentary section of a further embodiment of the invention.

Referring to FIGS. 1 to 4 of the drawings, an electronic component 1 is provided with two or more metal leads 2 that project from it. If the component is a monolithic integrated circuit, there may be as many as fourteen leads, but only two are shown in the drawings. Each lead originally is flat, being made from a narrow ribbon of the desired length and, typically, .015″ wide and .004″ thick. It is a feature of this invention that at least the bottom of the lead is provided with a large number of minute protrusions 3. These may be formed with a die and press, by a rolling technique such as knurling, or by other means. For best results, the protrusions are arranged in parallel rows and are in the form of pyramids or cones having sharp ends.

When a lead has the dimensions mentioned above, it is desirable to provide about .050 inch of its length with the protrusions. By making them about .002″ wide at the base and about that high, about eighty of them can be located on one side of the lead. Preferably, both sides of the lead are provided with these protrusions so that the component can be used either side up.

The material of the leads should be a fairly hard alloy for best results. Many nickel base and copper base alloys are suitable. During the forming of the leads the metal can be further hardened by cold working. By applying a thin gold film of 30 to 50 microns thick to the entire surface of a lead, it can be protected from corrosion.

This component is designed to be connected into a printed circuit. For that purpose an insulating base 5 is provided with a printed circuit and the electronic component is placed in the desired location over the base with its leads 2 overlying and engaging two of the flat metal circuit conductors 6 on the base. Preferably, the conductors are made of soft copper foil about .003″ thick covered with a light gold film. The leads may be provided with offsets to locate their end portions in substantially the same plane as the bottom of the component. The leads then are pressed tightly against the metal conductors to press the protrusions 3 into the conductors and thereby form good electrical connection with them. Another feature of this invention is that this is done by a body 7 of elastomeric material which is placed on top of each lead and is held in a compressed state so that it will exert downward pressure against the lead. For the dimensions given above, the thickness of the elastomer body need be no greater than about .015″. Because of its stability over a wide range of ambient conditions, silicone rubber is recommended, although other rubber-like materials also can be used.

The force that compresses the elastomer body may be exerted by a rigid metal backing member 8 that may be likened to a tiny plate. This member may be provided with lugs 9 at opposite edges that are attached to the insulating base, such as by extending through holes 10 in the base and being bent against its lower surface. The pressure of the elastomer body against the lead produces intimate metal-to-metal contact between the lead and underlying conductor, which is akin to cold welding due to the large number of points on the lead that penetrate the conductor, as shown in FIG. 3.

In FIG. 5 another way of holding an elastomer body 11 under compression is illustrated. In this modification the elastomer body is cemented to the bottom of a rigid backing member 12 on top of it and to the top of the insulating base 13 at opposite sides of the superimposed conductor 14 and lead 15 while the body is held under compression by external pressure temporarily applied to the top of the metal member. When the adhesive 16 has set and the external pressure has been removed, the portions of the elastomer body at opposite edges of the lead will be under tension and will hold the portion of the body above the lead compressed against it. The flat backing member 12 prevents the central portion of the elastomer body from bowing upwardly and releasing its pressure against the lead. Also, the upper surface of the body attached to the backing member will be under tension in a plane parallel to the base, and that will help hold the compression in the central portion of the elastomer body. A preferred adhesive is a thermosetting material that may be applied before the elastomer body is compressed and then cured while the body is being held under compression by external means.

In the further modification of the invention shown in FIG. 6, the metal lead 18 again is provided with a large number of minute protrusions 19 on its lower surface penetrating an electrical conductor 20 on an insulating base 21. However, before the lead was applied to the conductor a film of metal adhesive was applied to the bottom of the lead. Then the lead was pressed tightly against the conductor. As the protrusions sank into the conductor, the adhesive on them was scraped off and pushed up against the body of the lead between the protrusions, forming a thin layer 22 that sets and secures the lead to the conductor as shown. In this case, no elastomeric body is necessary.

With any of the connections disclosed herein, the electrical contact between the parts is more reliable than solder or welded single point contacts. Furthermore, the connections can be made at several leads simultaneously when the component is set in place. It also is easy to remove the component for replacement. Finally, these connections require no high temperature.

According to the provisions of the the patent statutes, I have explained the principle of my invention and have illustrated and described what I now consider to represent its best embodiment. However, I desire to have it understood that, within the scope of the appended claims, the invention may be practiced otherwise than as specifically illustrated and described.

I claim:

1. The combination with an insulating base, a flat metal electrical conductor thereon, and an electronic component adjacent the conductor, of a metal lead projecting from the component above said conductor and having a plurality of minute protrusions on its bottom engaging the conductor, and means holding said lead against the conductor with said protrusions pressed into it.

2. The combination with an insulating base, a flat metal electrical conductor thereon, and an electronic component adjacent the conductor, of a metal lead projecting from the component above said conductor and having a plurality of minute protrusions on its bottom pressed into the conductor, and adhesive between the upper surface of the conductor and the overlying lead holding them together.

3. The combination with an insulating base, a flat metal electrical conductor thereon, and an electronic component adjacent the conductor, of a metal lead projecting from the component above said conductor and having a plurality of minute protrusions on its bottom engaging the conductor, an elastomer body engaging the top of the lead, and means holding said body compressed against said lead to press said protrusions into the conductor.

4. The combination defined in claim 3, in which said means includes a rigid backing member on top of said body.

5. The combination defined in claim 3, in which said means is a rigid backing member on top of said body and anchored to said base.

6. The combination with an insulating base, a flat metal electrical conductor thereon, and an electronic component adjacent the conductor, of a metal lead projecting from the component above said conductor and having a plurality of minute protrusions on its bottom engaging the conductor, an elastomer body compressed against the top of the lead and projecting laterally from the opposite sides thereof, a rigid backing member covering the top of said body, and adhesive securing said body to the bottom of said member and to the top of the base at opposite sides of the conductor, whereby said body presses said protrusions into the conductor.

References Cited

UNITED STATES PATENTS

| | | | |
|---|---|---|---|
| 2,615,946 | 10/1952 | Katzman | 317—260 X |
| 2,854,074 | 9/1958 | Frank et al. | 174—94 X |

FOREIGN PATENTS

| | | |
|---|---|---|
| 954,600 | 6/1949 | France. |

DARRELL L. CLAY, *Primary Examiner.*